US006777318B2

(12) United States Patent
Jeng et al.

(10) Patent No.: US 6,777,318 B2

(45) Date of Patent: Aug. 17, 2004

(54) ALUMINUM/COPPER CLAD INTERCONNECT LAYER FOR VLSI APPLICATIONS

(75) Inventors: Shin-Puu Jeng, Hsinchu (TW); Shang-Yun Hou, Hsinchu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 45 days.

(21) Appl. No.: 10/222,361

(22) Filed: Aug. 16, 2002

(65) Prior Publication Data

US 2004/0033685 A1 Feb. 19, 2004

(51) Int. Cl.[7] ................................................ H01L 21/44

(52) U.S. Cl. ....................... 438/598; 438/618; 438/622; 438/627; 438/629; 438/643; 438/653; 438/672; 438/687; 438/688

(58) Field of Search ................................ 438/598, 618, 438/622, 627, 629, 643, 653, 672, 687–688

(56) References Cited

U.S. PATENT DOCUMENTS 4,853,491 A 8/1989 Butt .......................... 174/52.4
4,915,983 A 4/1990 Lake et al. ................... 427/98
5,525,836 A 6/1996 Mennucci ................... 257/748
5,767,012 A * 6/1998 Fulford, Jr. et al. ........ 438/622
5,981,374 A * 11/1999 Dalal et al. ................. 438/624
6,075,711 A * 6/2000 Brown et al. ............... 257/684
6,133,139 A * 10/2000 Dalal et al. ................. 438/624
6,174,742 B1 * 1/2001 Sudhindranath et al. .... 438/598
6,400,575 B1 * 6/2002 Brown et al. ............... 257/698
6,413,848 B1 * 7/2002 Giust et al. ................. 438/601
6,614,091 B1 * 9/2003 Downey et al. ............ 257/499
2002/0037642 A1 * 3/2002 Wake et al. ................ 438/687
2003/0173667 A1 * 9/2003 Yong et al. ................. 257/748

* cited by examiner

*Primary Examiner*—Lynne A. Gurley
(74) *Attorney, Agent, or Firm*—George O. Saile; Stephen B. Ackerman; Stephen G. Stanton

(57) ABSTRACT

A method of forming at least one aluminum/copper clad interconnect comprising the following steps. A substrate is provided having an overlying patterned dielectric layer. The patterned dielectric layer having at least one lower opening. The at least one lower opening is lined with a first barrier layer. At least one planarized copper portion is formed within the at least one first barrier layer lined lower opening. A patterned layer is formed over the at least one planarized copper portion and the patterned dielectric layer. The patterned layer has at least one upper opening exposing at least a portion of the at least one planarized copper portion. The at least one upper opening is lined with a second barrier layer. At least one aluminum portion is formed within the at least one second barrier layer lined opening to form the at least one aluminum/copper clad interconnect.

33 Claims, 5 Drawing Sheets

ALUMINUM/COPPER CLAD INTERCONNECT LAYER FOR VLSI APPLICATIONS

BACKGROUND OF THE INVENTION

FIG. 1 schematically illustrates a view of the external wiring scheme of a semiconductor chip 10. Active bump pads 12 are electrically connected to corresponding wire bond pads 14 by redistribution layer (RDL), or global routing layer, of metal 16 having respective metal lines 18. A fuse block 20 may also be included in the scheme.

In order to minimize the resistance (IR) drop over a chip, a thick copper (Cu) layer of from about 1 to 3 μm is used as the global routing layer 16.

U.S. Pat. No. 4,915,983 to Lake et al. describes a multilayer circuit board fabrication process.

U.S. Pat. No. 4,853,491 to Butt describes a chip carrier for mounting a semiconductor chip.

U.S. Pat. No. 5,525,836 to Mennucci describes a multilayer metal leadframe comprising copper (Cu) or a copper alloy.

SUMMARY OF THE INVENTION

Accordingly, it is an object of one or more embodiments of the present invention to provide an improved method of fabricating global routing layers.

It is another object of one or more embodiments of the present invention to provide an improved, lower cost method of fabricating global routing layers.

Other objects will appear hereinafter.

It has now been discovered that the above and other objects of the present invention may be accomplished in the following manner. Specifically, a substrate is provided having an overlying patterned dielectric layer. The patterned dielectric layer having at least one lower opening. The at least one lower opening is lined with a first barrier layer. At least one planarized copper portion is formed within the at least one first barrier layer lined lower opening. A patterned layer is formed over the at least one planarized copper portion and the patterned dielectric layer. The patterned layer has at least one upper opening exposing at least a portion of the at least one planarized copper portion. The at least one upper opening is lined with a second barrier layer. At least one aluminum portion is formed within the at least one second barrier layer lined opening to form the at least one aluminum/copper clad interconnect.

DESCRIPTION OF THE DRAWINGS

The present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Problems Known to the Inventors

The following problems are known to the inventors and are not to be considered as prior art against the instant invention.

The inventors have discovered that when using such a thick Cu global routing layer 16 of from about 1 to 3 μm, several processing issues are raised such as bowl-like metal voids, high hillock susceptibility, high stress and a required deep fuse window etch (from about 2 to 4 μm) requirement.

Initial Structure

Figure 1:
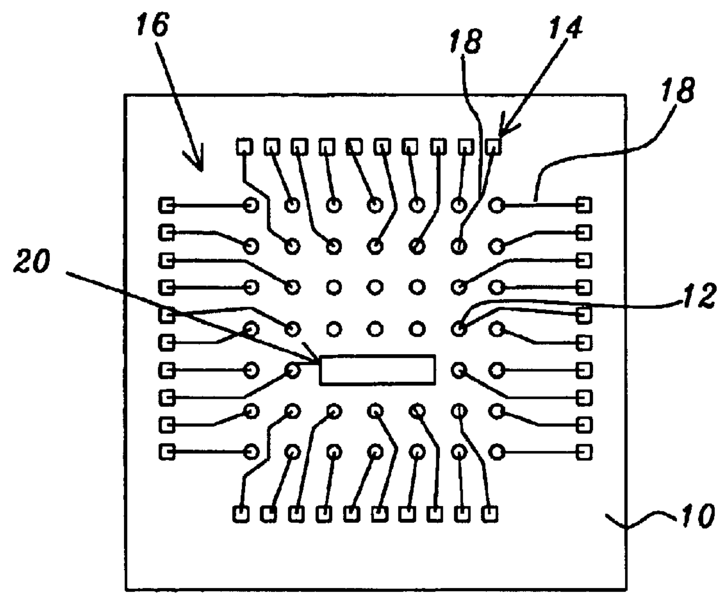
FIG. 1 schematically illustrates a semiconductor chip's external wiring scheme.
Figure 2:
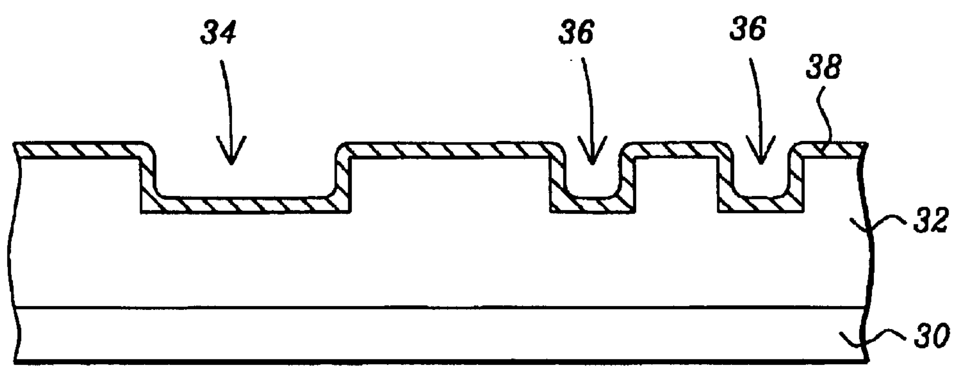
FIGS. 2 to 8 schematically illustrate a preferred embodiment of the present invention.

As shown in FIG. 2, structure 30 is preferably a silicon substrate and includes an overlying patterned dielectric layer 32 having pad/redistribution layer (RDL) metal (or global routing metal layer) opening 34 and fuse openings 36. Pad/RDL metal opening 34 and fuse openings 36 have a depth of preferably from about 1 to 3 μm, depending on the chip size and application, and are preferably formed by a dual damascene process.

Silicon substrate 30 is understood to possibly include a semiconductor wafer or substrate, active and passive devices formed within the wafer, conductive layers and dielectric layers (e.g., inter-poly oxide (IPO), intermetal dielectric (IMD), etc.) formed over the wafer surface. The term "semiconductor structure" is meant to include devices formed within a semiconductor wafer and the layers overlying the wafer.

Dielectric layer 32 is preferably comprised of a dielectric layer such as USG, FSG or Black Diamond™ and is more preferably USG.

A barrier layer 38 having a thickness of preferably from about 250 to 1000 Å and more preferably from about 500 to 600 Å is preferably formed over patterned dielectric layer 32, lining Pad/RDL metal opening 34 and fuse openings 36. Barrier layer 38 is preferably comprised of TaN or Ta and is more preferably comprised of TaN.

Formation of Copper Layer 40

Figure 3:
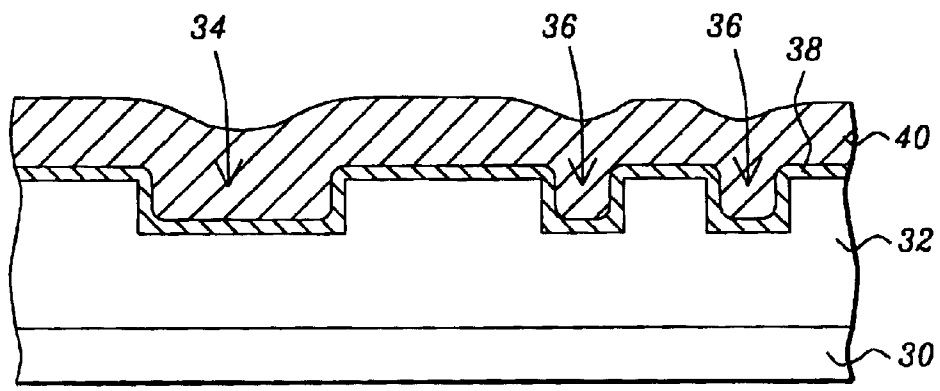

As shown in FIG. 3, a copper layer 40 is formed over barrier layer 38, at least filling pad/RDL metal opening 34 and fuse openings 36.

Planarization of Copper Layer 40

Figure 4:
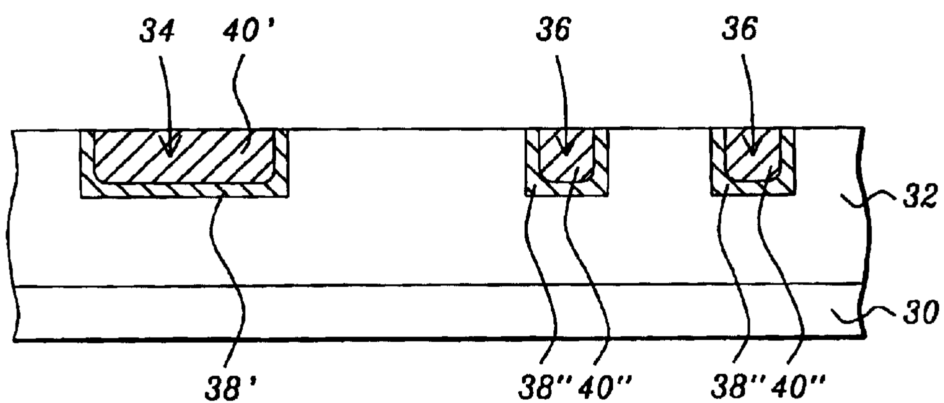

As shown in FIG. 4, the excess of copper layer 40 and barrier layer 38 over patterned dielectric layer 32 is removed by planarization and preferably by chemical mechanical polishing to form planarized copper portions 40'; 40" within pad/RDL metal opening 34 and fuse openings 36, respectively. Copper portions 40'; 40" each have a thickness of from about 1 to 3 μm.

Formation of Patterned SiN 41/PEOX 42/SiN 43 Stack 45

Figure 5:
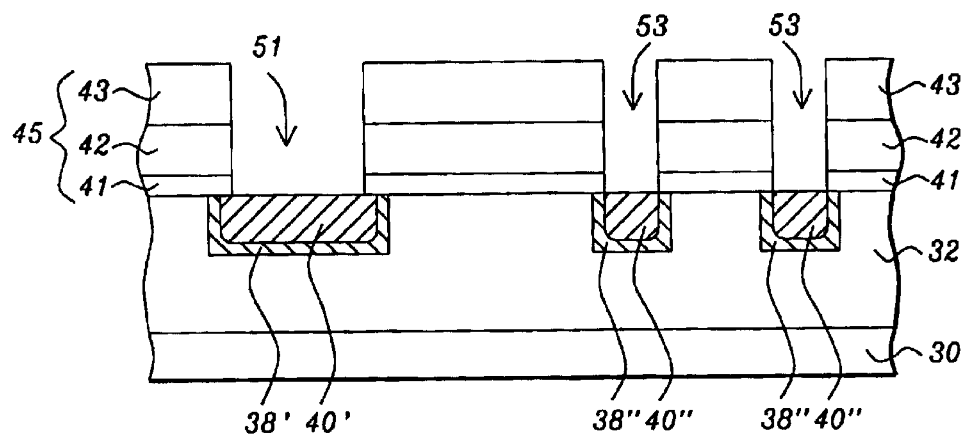

As shown in FIG. 5, an SiN/PEOX/SiN stack/passivation layer 45 is formed over patterned dielectric layer 32 and planarized copper portions 40', 40". SiN/PEOX/SiN stack 45 comprises: (1) a lower silicon nitride (SIN) layer 41 having a thickness of preferably from about 500 to 1000 Å and more preferably about 750 Å; (2) a plasma enhanced silicon oxide layer (PEOX) 42 having a thickness of preferably from about 2000 to 6000 Å and more preferably about 4000 Å; and (3) an upper SiN layer 43 having a thickness of preferably from about 2800 to 6000 Å and more preferably about 4000 Å.

The SiN/PEOX/SiN stack 45 is patterned to forming passivation openings 51, 53 exposing at least a portion of planarized copper portions 40'; 40", respectively.

Formation of Barrier Layer 44

Figure 6:
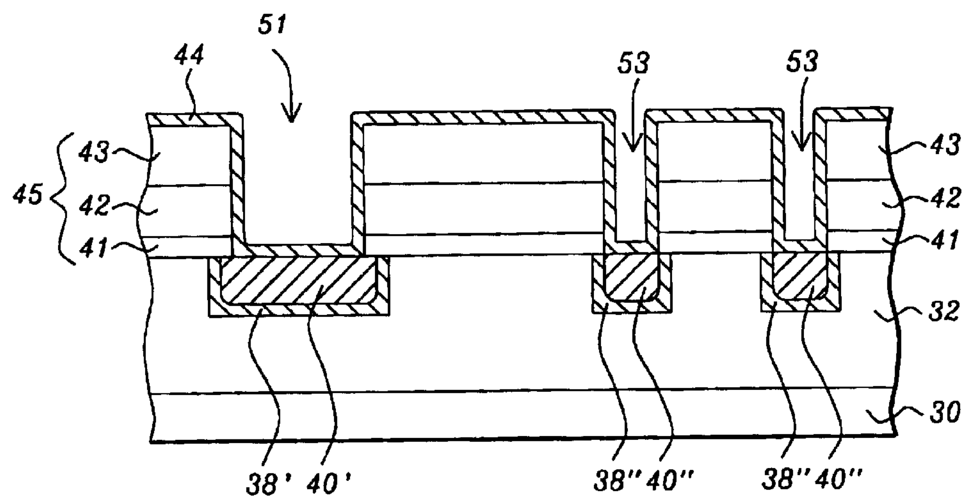

As shown in FIG. 6, a barrier layer 44 having a thickness of preferably from about 250 to 800 Å and more preferably about 600 Å is preferably formed over patterned SiN/PEOX/SiN stack 45, lining passivation openings 51, 53. Barrier layer 44 is preferably comprised of TaN or Ta and is more preferably comprised of TaN.

Formation of Metal Layer 50

Figure 7:
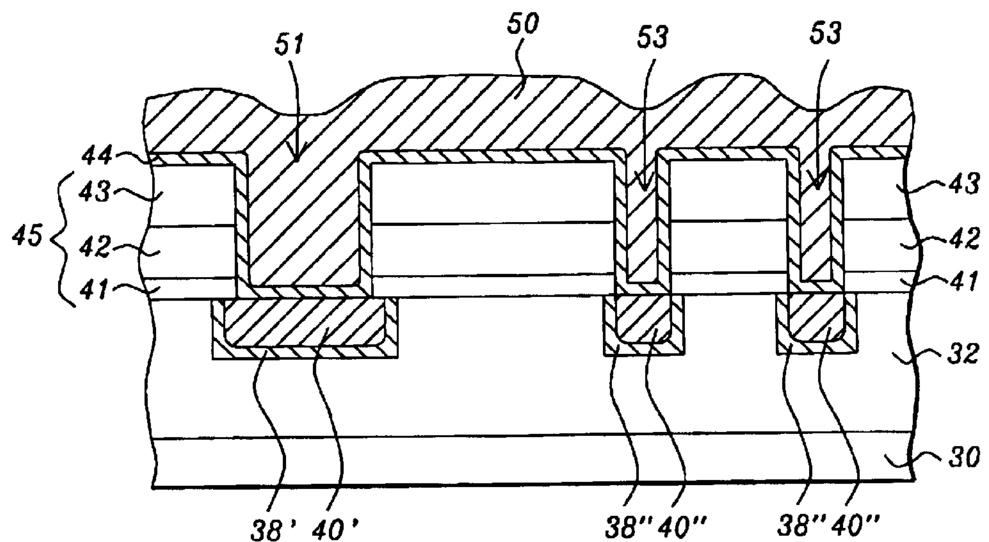

As shown in FIG. 7, a metal layer 50 is formed over barrier layer 44, at least filling passivation openings 51, 53. Metal layer 50 is preferably comprised of aluminum (Al).

Planarization of Metal Layer 50

Figure 8:
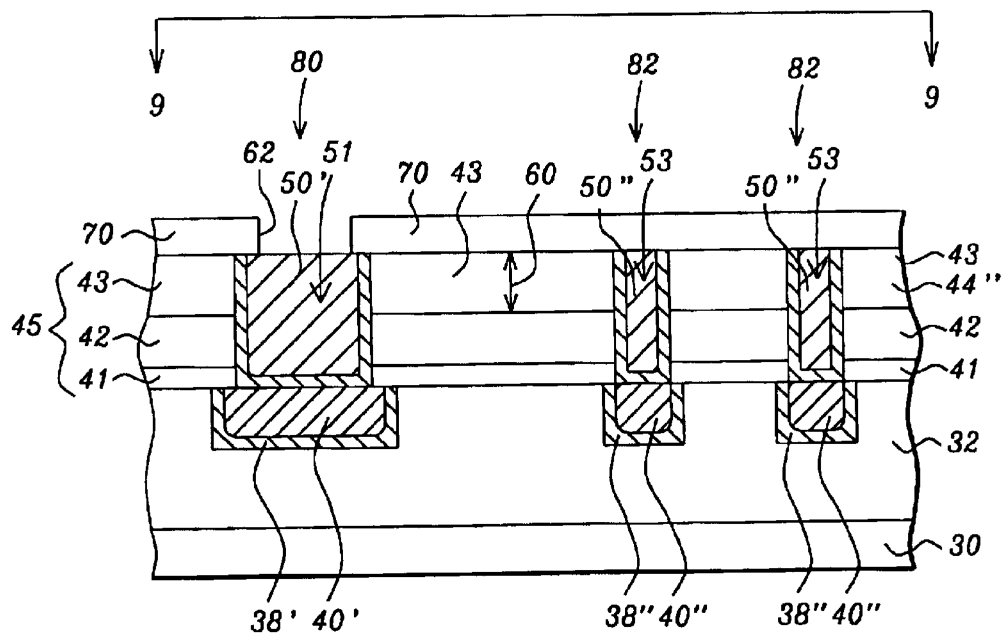

As shown in FIG. 8, metal layer 50 is patterned using a photolithography and etching to form metal portions 50', within respective passivation openings 51, 53 that serve as fuse links.

The respective planarized copper portions 40'; 40" and metal portions 50'; 50" comprise aluminum/copper clad interconnects 80; 82.

Further processing may then proceed, for example a patterned passivation layer 70 may be formed over the aluminum portions 50', 50" and the patterned SiN/PEOX/SiN stack 45. The patterned passivation layer 70 exposes at least a portion of the aluminum portion 50' through opening 62. Opening 62 exposing at least a portion of aluminum portion 50' is used for subsequent package/assembly processes.

Thus, no extra process steps are necessary to form the Al/Cu clad interconnects 40', 50'; 40", 50".

Figure 9:
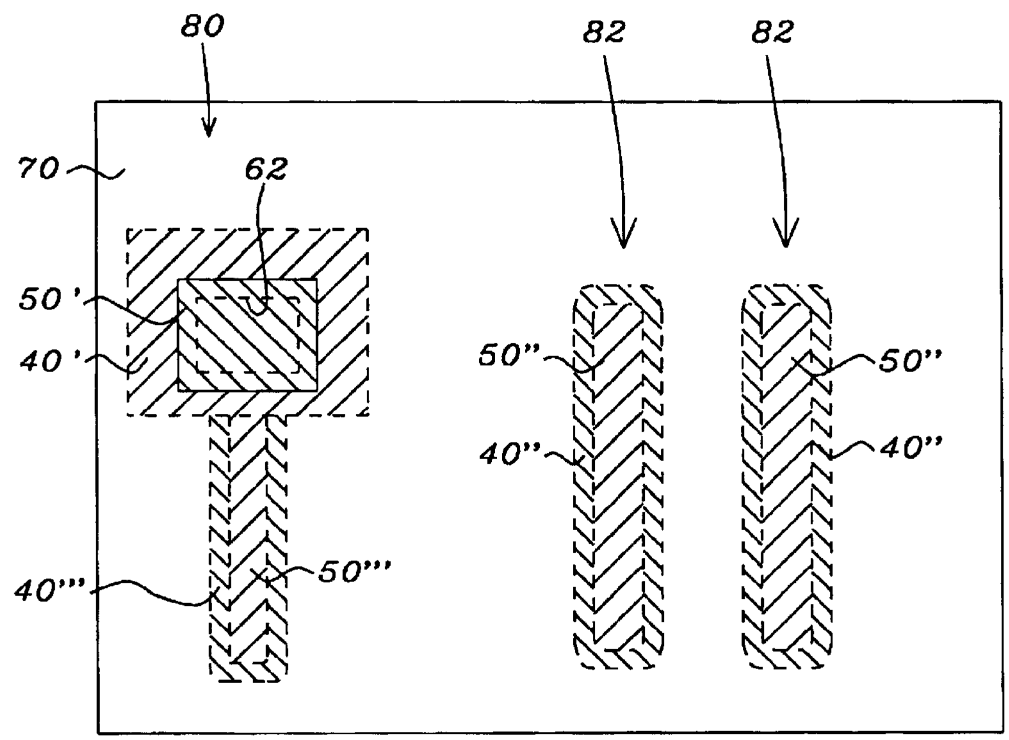
FIG. 9 is a schematic top down, partial cut-away plan view of FIG. 8 taken along line 9—9.

As shown in FIG. 9, a schematic top down, partial cut-away plan view of FIG. 8 taken along line 9—9, aluminum pad layer 50', partially exposed through opening 62 of patterned passivation layer 70, overlies planarized copper portion 40'; and aluminum portions 50" overlie planarized copper portions 40". The resistance (IR) drop reductions is achieved by the aluminum lines 50', 50" which run parallel to the copper lines 40', 40".

Advantages of the Present Invention

The advantages of one or more embodiments of the present invention include:

1. the IR drop is minimized with Al/Cu cladding;
2. the required Cu thickness is reduced, decreasing process issues; and
3. no extra process steps are necessary.

While particular embodiments of the present invention have been illustrated and described, it is not intended to limit the invention, except as defined by the following claims.

We claim:

1. A method of forming at least one aluminum/copper clad routing layer, comprising the steps of:

providing a substrate having an overlying patterned dielectric layer; the patterned dielectric layer having at least one lower opening;

lining the at least one lower opening with a first barrier layer;

forming at least one lower copper routing layer portion within the at least one first barrier layer lined lower opening;

forming a patterned layer over the at least one lower copper routing layer portion and the patterned dielectric layer; the patterned layer having at least one upper opening exposing at least a portion of the at least one lower copper routing layer portion;

lining the at least one upper opening with a second barrier layer; and forming at least one upper aluminum routing layer portion within the at least one second barrier layer lined upper opening to form the at least one aluminum/copper clad routing layer.

2. The method of claim 1, wherein the substrate is a silicon substrate, the patterned dielectric layer is comprised of a material selected from the group consisting of USG, FSG and Black Diamond™; the first barrier layer is comprised of TaN or Ta; the patterned layer is comprised of a SiN/PEOX/SiN stack; and the second barrier layer 44 is comprised of TaN or Ta.

3. The method of claim 1, wherein the substrate is a silicon substrate, the patterned dielectric layer is comprised of USC; the first barrier layer is comprised of TaN; the patterned layer is comprised of a SiN/PEOX/SiN stack; and the second barrier layer is comprised of TaN.

4. The method of claim 1, wherein the first barrier layer has a thickness of from about 250 to 1000 Å; the at least one planarized copper portion has a thickness of from about 1 to 3 $\mu$m; the patterned layer has a thickness of from about 5300 to 13,000 Å; and the second barrier layer has a thickness of from about 250 to 800 Å.

5. The method of claim 1, wherein the first barrier layer has a thickness of from about 500 to 600 Å; the patterned layer has a thickness of about 8750 Å; and the second barrier layer has a thickness of about 600 Å.

6. The method of claim 1, wherein the patterned layer is comprised of a lower SiN layer having a thickness of from about 500 to 1000 Å; a middle PEOX layer having a thickness of from about 2000 to 6000 Å; and an upper SiN layer having a thickness of from about 2800 to 6000 Å.

7. The method of claim 1, wherein the patterned layer is comprised of a lower SiN layer having a thickness of about 750 Å; a middle PEOX layer having a thickness of about 4000 Å; and an upper SiN layer having a thickness of about 4000 Å.

8. The method of claim 1, wherein the at least one lower copper routing layer portion is planarized by a chemical mechanical polishing process and the at least one upper aluminum routing layer portion is patterned using a photolithography and etching process.

9. The method of claim 1, including the step of forming a passivation layer over the patterned layer and the at least one upper aluminum routing layer portion.

10. The method of claim 1, including the step of forming a patterned passivation layer over the patterned layer and the at least one upper aluminum routing layer portion; the patterned passivation layer having at least one opening exposing at least a portion of the at least one upper aluminum routing layer portion.

11. The method of claim 1, wherein the at least one aluminum/copper clad routing layer is selected from the group consisting of: a pad; an RDL metal line; and a fuse, wherein no metal layer is formed thereabove.

12. A method of forming at least one aluminum/copper clad routing layer, comprising the steps of:

providing a substrate having an overlying patterned dielectric layer; the patterned dielectric layer having at least one lower opening;

lining the at least one lower opening with a first barrier layer;

forming a copper layer over the first barrier layer to at least fill the at least one first barrier layer lined lower opening;

planarizing the copper layer to form at least one lower copper routing layer portion within the at least one first barrier layer lined lower opening;

forming a patterned layer over the at least one lower copper routing layer portion and the patterned dielectric layer; the patterned layer having at least one upper opening exposing at least a portion of the at least one lower copper routing layer portion;

lining the at least one upper opening with a second barrier layer;

forming an aluminum layer over the second barrier layer to at least fill the at least one second barrier layer lined upper opening; and patterning the aluminum layer to form at least one upper aluminum routing layer portion within the at least one second barrier layer lined upper opening to form the at least one aluminum/copper clad routing layer.

13. The method of claim 12, wherein the substrate is a silicon substrate, the patterned dielectric layer is comprised of a material selected from the group consisting of USG, FSG and Black Diamond™; the first barrier layer is comprised of TaN or Ta; the patterned layer is comprised of a SiN/PEOX/SiN stack; and the second barrier layer is comprised of TaN or Ta.

14. The method of claim 12, wherein the substrate is a silicon substrate, the patterned dielectric layer is comprised of USC; the first barrier layer is comprised of TaN; the patterned layer is comprised of a SiN/PEOX/SiN stack; and the second barrier layer is comprised of TaN.

15. The method of claim 12, wherein the first barrier layer has a thickness of from about 250 to 1000 Å; the at least one planarized copper portion has a thickness of from about 1 to 3 $\mu$m; the patterned layer has a thickness of from about 5300 to 13,000 Å; and the second barrier layer has a thickness of from about 250 to 800 Å.

16. The method of claim 12, wherein the first barrier layer has a thickness of from about 500 to 600 Å; the patterned layer has a thickness of about 8750 Å; and the second barrier layer has a thickness of about 600 Å.

17. The method of claim 12, wherein the patterned layer is comprised of a lower SiN layer having a thickness of from about 500 to 1000 Å; a middle PEOX layer having a thickness of from about 2000 to 6000 Å; and an upper SiN layer having a thickness of from about 2800 to 6000 Å.

18. The method of claim 12, wherein the patterned layer is comprised of a lower SiN layer having a thickness of about 750 Å; a middle PEOX layer having a thickness of about 4000 Å; and an upper SiN layer having a thickness of about 4000 Å.

19. The method of claim 12, wherein the at least one lower copper routing layer portion is planarized by a chemical mechanical polishing process and the at least one upper aluminum routing layer portion is patterned using a photolithography and etching process.

20. The method of claim 12, including the step of forming a passivation layer over the patterned layer and the at least one upper aluminum routing layer portion.

21. The method of claim 12, including the step of forming a patterned passivation layer over the patterned layer and the at least one upper aluminum routing layer portion; the patterned passivation layer having at least one opening exposing at least a portion of the at least one upper aluminum routing layer portion.

22. The method of claim 12, wherein the at least one aluminum/copper clad routing layer is selected from the group consisting of: a pad; an RDL metal line; and a fuse.

23. A method of forming at least one aluminum/copper clad routing layer, comprising the steps of:

providing a substrate having an overlying patterned dielectric layer; the patterned dielectric layer having at least one lower opening;

lining the at least one lower opening with a first barrier layer;

forming a copper layer over the first barrier layer to at least fill the at least one first barrier layer lined lower opening;

planarizing the copper layer to form at least one lower copper routing layer portion within the at least one first barrier layer lined lower opening;

forming a patterned SiN/PEOX/SiN stack layer over the at least one lower copper routing layer portion and the patterned dielectric layer; the patterned SiN/PEOX/SiN stack layer having at least one upper opening exposing at least a portion of the at least one lower copper routing layer portion;

lining the at least one upper opening with a second barrier layer;

forming an aluminum layer over the second barrier layer to at least fill the at least one second barrier layer lined upper opening; and patterning the aluminum layer to form at least one upper aluminum routing layer portion within the at least one second barrier layer lined opening to form the at least one aluminum/copper clad routing layer.

24. The method of claim 23, wherein the substrate is a silicon substrate, the patterned dielectric layer is comprised of a low-k material selected from the group consisting of USG, FSG and Black Diamond™; the first barrier layer is comprised of TaN or Ta; and the second barrier layer is comprised of TaN or Ta.

25. The method of claim 23, wherein the substrate is a silicon substrate, the patterned dielectric layer is comprised of USG; the first barrier layer is comprised of TaN; and the second barrier layer is comprised of TaN.

26. The method of claim 23, wherein the first barrier layer has a thickness of from about 250 to 1000 Å; the at least one planarized copper portion has a thickness of from about 1 to 3 $\mu$m; the SiN/PEOX/SiN stack layer has a thickness of from about 5300 to 13,000 Å; and the second barrier layer has a thickness of from about 250 to 800 Å.

27. The method of claim 23, wherein the first barrier layer has a thickness of from about 500 to 600 Å; the SiN/PEOX/SiN stack layer has a thickness of about 8750 Å; and the second barrier layer has a thickness of about 600 Å.

28. The method of claim 23, wherein the SiN/PEOX/SiN stack layer is comprised of a lower SiN layer having a thickness of from about 500 to 1000 Å; a middle PEOX layer having a thickness of from about 2000 to 6000 Å; and an upper SiN layer having a thickness of from about 2800 to 6000 Å.

29. The method of claim 23, wherein the SiN/PEOX/SiN stack layer is comprised of a lower SiN layer having a thickness of about 750 Å; a middle PEOX layer having a thickness of about 4000 Å; and an upper SiN layer having a thickness of about 4000 Å.

30. The method of claim 23, wherein the at least one lower copper routing layer portion is planarized by a chemical mechanical polishing process and the at least one upper aluminum routing layer portion is patterned using a photolithography and etching process.

31. The method of claim 23, including the step of forming a passivation layer over the patterned layer and the at least one upper aluminum routing layer portion.

32. The method of claim 23, including the step of forming a patterned passivation layer over the patterned layer and the at least one upper aluminum routing layer portion; the patterned passivation layer having at least one opening exposing at least a portion of the at least one upper aluminum routing layer portion.

33. The method of claim 23, wherein the at least one aluminum/copper clad routing layer is selected from the group consisting of: a pad; an RDL metal line; and a fuse.

* * * * *